United States Patent
Molendijk et al.

(10) Patent No.: US 12,355,456 B2
(45) Date of Patent: Jul. 8, 2025

(54) TIME INTERLEAVED ANALOG-TO-DIGITAL CONVERTER WITH ADC UNIT CORRECTION

(71) Applicant: NXP B.V., Eindhoven (NL)

(72) Inventors: Maarten Jelmar Molendijk, Eindhoven (NL); Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 247 days.

(21) Appl. No.: 18/201,085

(22) Filed: May 23, 2023

(65) Prior Publication Data

US 2024/0396565 A1    Nov. 28, 2024

(51) Int. Cl.
| | |
|---|---|
| H03M 1/06 | (2006.01) |
| G06N 3/084 | (2023.01) |
| H03M 1/10 | (2006.01) |
| H03M 1/12 | (2006.01) |

(52) U.S. Cl.
CPC .......... *H03M 1/0607* (2013.01); *G06N 3/084* (2013.01); *H03M 1/1009* (2013.01); *H03M 1/1038* (2013.01); *H03M 1/121* (2013.01); *H03M 1/1215* (2013.01)

(58) Field of Classification Search
CPC ............. H03M 1/0607; H03M 1/1215; H03M 1/1038; H03M 1/1009; H03M 1/121; G06N 3/084
See application file for complete search history.

(56) References Cited

U.S. PATENT DOCUMENTS

| | | | |
|---|---|---|---|
| 9,071,262 B1 * | 6/2015 | Malkin | H04B 17/21 |
| 9,294,112 B1 * | 3/2016 | Devarajan | H03M 1/0836 |
| 11,101,810 B1 | 8/2021 | Veldhoven | |
| 2016/0182073 A1 | 6/2016 | Speir et al. | |
| 2022/0019883 A1 | 1/2022 | Veldhoven | |

OTHER PUBLICATIONS

Danfeng Zhai et al., High-Speed and Time-Interleaved ADCs Using Additive-Neural-Network-Based Calibration for Nonlinear Amplitude and Phase Distortion, IEEE Transactions on Circuits and Systems—I: Regular Paper, Apr. 2022, pp. 1-14, IEEE, China.
Ware, E., "6GS/s 8-channel CIC SAR TI-ADC with Neural Network Calibration", ESSCIRC 2022—IEEE 48th European Solid-State Circuits Conference (ESSCIRC), Sep. 19-22, 2022.

* cited by examiner

*Primary Examiner* — Khai M Nguyen

(57) ABSTRACT

A system includes a time-interleaved analog-to-digital converter (TI ADC). The TI ADC includes a plurality of ADC units connected in parallel between an input terminal and an output terminal of the time-interleaved ADC. An ADC tag generator is configured to output a first identifier of a first ADC unit of the plurality of ADC when the first ADC unit is enabled. An error correction system is configured to receive a first digital signal from the output terminal of the time-interleaved ADC, receive the first identifier of the first ADC unit from the ADC tag generator, modify the first digital signal to generate a first corrected digital signal by compensating for first analog-to-digital conversion errors occurring within the first ADC unit by applying a first error correction scheme that is associated with the first ADC unit, and output the first corrected digital signal.

20 Claims, 10 Drawing Sheets

TIME INTERLEAVED ANALOG-TO-DIGITAL CONVERTER WITH ADC UNIT CORRECTION

TECHNICAL FIELD

Errors in analog to digital converters (ADCs) that rely on time interleaving outputs from a number of independent ADCs are compensated for by use of a machine learning system, that may comprise a neural network. The machine learning system can be trained based on simulation or measurement data in combination with data from an external timing source. The effect on the analog to digital conversion errors by process-voltage-temperature (PVT) parameters may be incorporated into the training of the machine learning system.

BACKGROUND

In electronics, an analog-to-digital converter ("ADC") is a system that converts an analog signal, such as a sound picked up by a microphone or light entering a digital camera, into a digital signal. An ADC may also provide an isolated measurement when implemented as an electronic device that converts an input analog voltage or current to a digital number representing the magnitude of the input voltage or current.

More specifically, an ADC converts a continuous-time and continuous-amplitude analog signal to a discrete-time and discrete-amplitude digital signal. The conversion involves quantization of the input, so the process necessarily introduces a small amount of error or noise. Furthermore, instead of continuously performing the conversion, an ADC does the conversion periodically, sampling the input signal at a sampling rate, thus limiting the allowable bandwidth of the input signal.

The performance of an ADC is primarily characterized by its bandwidth and signal-to-noise and distortion ratio ("SNDR"). The bandwidth of an ADC is characterized primarily by its sampling rate. The SNDR of an ADC is influenced by many factors, including the resolution, linearity, and accuracy (how well the quantization levels match the true analog signal), aliasing, and jitter.

The effective sampling rate of a time-interleaved (TI) ADC device can be increased by operating a number of separate ADC units in parallel. By time-interleaving the outputs of each individual ADC unit, an input signal can be processed at a higher sampling rate than the sampling rate of an individual ADC unit.

Although this approach can be used to increase the effective sampling rate of the TI ADC, because the individual ADC units will each exhibit small differences in gain and offset, the final processed output signal may include a time-domain error pattern that requires correction.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
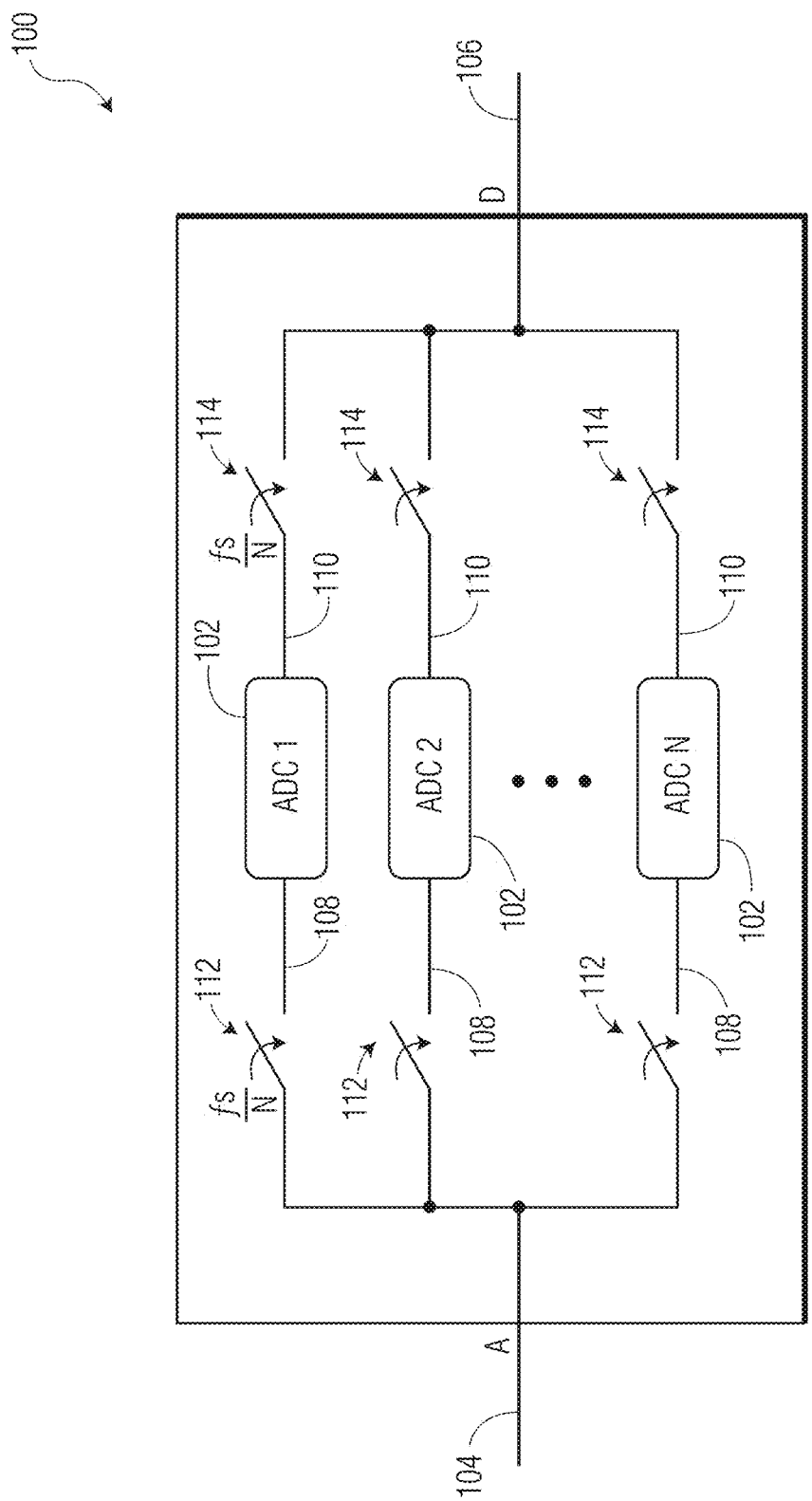
FIG. 1 depicts a TI ADC device comprising a number (N) of individual ADC units numbered ADC 1, ADC 2, . . . , ADC N.

The following detailed description is merely illustrative in nature and is not intended to limit the embodiments of the subject matter of the application and uses of such embodiments. As used herein, the words "exemplary" and "example" mean "serving as an example, instance, or illustration." Any implementation or embodiment described herein as exemplary, or an example is not necessarily to be construed as preferred or advantageous over other implementations. Furthermore, there is no intention to be bound by any expressed or implied theory presented in the preceding technical field, background, or the following detailed description.

The effective sampling rate of an analog-to-digital converter (ADC) system can be increased by time-interleaving the outputs of a number of individual ADC units. In that configuration, the outputs of the individual ADC units can be sampled at a sampling frequency that is higher than the sampling rates of the individual ADC units to generate an output signal having an effective sampling rate at the higher sampling frequency.

Although time-interleaving is a useful approach for increasing the effective sampling rate of an ADC device, variances in the gain and offset error of each individual ADC unit within the TI ADC device can generate noise in the output signal of the TI ADC device. The noise will typically having a time-domain fixed pattern as the errors are introduced by the various individual ADC units at the time their output signals are being actively sampled.

During the design phase of a TI ADC device, the design of the individual ADC units can be optimized (e.g., via improved integrated circuit (IC) design and other design factors) in an attempt to minimize the effects of this gain and offset error. But this effort can significantly increase the cost of the TI ADC device. Additionally, even with that additional cost, process variations between the individual ADC units can still introduce ADC unit-specific gain and offset errors.

In an embodiment of the present system, a machine learning engine (MLE), such as a neural network, is incorporated into an TI ADC device to analyze and adjust the output of the TI ADC to compensate for variations in gain and offset errors between the individual ADC units. Such a machine learning system may be used to provide such error correction without a need to mathematically model these error signals. Instead, the machine learning system can be trained to receive the distorted TI ADC device output signal and apply a learned mathematical transformation to correct the distortions to generate a more accurate output signal. As described herein, in addition to being utilized to correct gain and offset errors, such a neural network may further be utilized to compensate and correct other types of errors that may be generated by the TI ADC device or its individual ADC units.

When implementing a machine learning system to provide this improved functionality, without an additional input, the machine learning system is unaware of which individual ADC unit is generating the current output of the TI ADC device. As a consequence, the machine learning system is generally incapable of characterizing the gain and offset error of a particular ADC unit within the TI ADC device. To enable the machine learning system to develop an error correction scheme that is customized for each individual ADC unit, the present disclosure contemplates an additional input to the machine learning system that identifies, for each output value being generated by the TI ADC device, the particular ADC unit that was responsible for generating that output value. By inputting such an ADC tag or identification value to the machine learning system, the machine learning system can learn and apply an appropriate correction scheme on an individual ADC unit basis.

Accordingly, this disclosure provides an improved TI ADC device implementation in which a machine learning system, with knowledge of the identity of the particular ADC unit responsible for generating a current output of the TI ADC device, applies an ADC unit-specific correction scheme to account for gain and offset errors (and, potentially, other errors) of that particular ADC unit.

When the machine learning system is implemented as a neural network, the neural network may be implemented using various machine learning techniques (e.g., artificial neural network, deep neural network, convolutional neural network, recurrent neural network, autoencoders, reinforcement learning, etc.), fuzzy logic, artificial intelligence ("AI"), deep learning algorithms, deep structured learning hierarchical learning algorithms, support vector machine ("SVM") (e.g., linear SVM, nonlinear SVM, SVM regression, etc.), decision tree learning (e.g., classification and regression tree ("CART"), ensemble methods (e.g., ensemble learning, Random Forests, Bagging and Pasting, Patches and Subspaces, Boosting, Stacking, etc.), dimensionality reduction (e.g., Projection, Manifold Learning, Principal Components Analysis, etc.) and/or deep machine learning algorithms. Non-limiting examples of publicly available machine learning algorithms, software, and libraries that could be utilized within embodiments of the present disclosure include Python, OpenCV, Inception, Theano, Torch, PyTorch, Pylearn2, Numpy, Blocks, TensorFlow, MXNet, Caffe, Lasagne, Keras, Chainer, Matlab Deep Learning, CNTK, MatConvNet (a MATLAB toolbox implementing convolutional neural networks for computer vision applications), DeepLearnToolbox (a Matlab toolbox for Deep Learning (from Rasmus Berg Palm)), BigDL, Cuda-Convnet (a fast C++/CUDA implementation of convolutional (or more generally, feed-forward) neural networks), Deep Belief Networks, RNNLM, RNNLIB-RNNLIB, matrbm, deeplearning4j, Eblearn.lsh, deepmat, MShadow, Matplotlib, SciPy, CXXNET, Nengo-Nengo, Eblearn, cudamat, Gnumpy, 3-way factored RBM and mcRBM, mPOT, ConvNet, Elektronn, OpenNN, NeuralDesigner, Theano Generalized Hebbian Learning, Apache Singa, Lightnet, and SimpleDNN.

The various embodiments disclosed herein are described with respect to utilization of an artificial neural network (also simply referred to herein as a "neural network"). However, a person of ordinary skill in the art is capable of implementing any appropriate machine learning system or other logical network for compensating for individual ADC unit errors in a time-interleaved TI ADC device in accordance with embodiments of the present disclosure.

A neural network is typically based on a collection of connected units or nodes referred to as artificial neurons, which loosely model the neurons in a biological brain. Each connection, like the synapses in a biological brain, can transmit a signal to other neurons. An artificial neuron that receives a signal then processes it and can signal neurons connected to it. In neural network implementations, the "signal" at a connection is a real number, and the output of each neuron is computed by some non-linear function of the sum of its inputs (e.g., sigmoid activation). The connections are referred to as edges. Neurons and edges typically have a weight that adjusts as training of the neural network proceeds. The weight increases or decreases the strength of the signal at a connection. Neurons may have a threshold such that a signal is sent only if the aggregate signal crosses that threshold. Typically, neurons are aggregated into layers. Different layers may perform different transformations on their inputs. Signals travel from the first layer (the input layer) to the last layer (the output layer), possibly after traversing the layers multiple times. A neural network architecture may be configured as a feed-forward network with one or more hidden layers, and with a backpropagation learning algorithm. Implementation of a neural network may involve three phases: a training, or learning, phase; a validation phase; and an inference, or production, phase. In the training phase, the neural network essentially learns by comparing its actual output with known correct outputs (or at least outputs that are more near a desired output) to find errors. It then modifies the model accordingly. In the validation phase, the trained neural network is verified by means of data ("validation set"), which may be different from the data used in the training phase. In the inference, or production, phase, the trained and validated neural network is now configured and capable of providing outputs that correspond to any input.

A result of the foregoing is a TI ADC device that utilizes an error-correction neural network that has been trained to "know" what the analog-to-digital conversion errors of each individual ADC unit of the TI ADC device are, and also to "know" how to compensate for those errors by applying an ADC unit-specific correction scheme.

As referred to herein, analog-to-digital conversion errors may be any type of distortion caused by circuitry within the individual ADC units (e.g., gain and offset errors) that result in the digital output signal of the TI ADC device not being a true or "ideal" digital conversion of the TI ADC device's input analog signal. Such analog-to-digital conversion errors may be caused by non-linearities within the individual ADC units, or any other defects or processing parameters that can produce ADC unit errors, which may take the form of noise, distortion, harmonics, etc. Each individual ADC unit of the TI ADC device can be any type of ADC implemented within any type of device or circuitry that utilizes an ADC. The neural networks described herein may be implemented with any type of hardware and/or software (as will be further disclosed herein), such as within an appropriate set of digital circuitry suitable for implementation of a neural network or other type of machine learning system. The illustration of the neural networks within the figures is not to be limiting upon the scope of embodiments of the present disclosure. Within the various figures, "(A)" represents that the signal is an analog signal, and "(D)" represents that the signal is a digital signal.

FIG. 1 depicts TI ADC device 100 comprising a number (N) of individual ADC units 102 (numbered ADC 1, ADC 2, ..., ADC N). TI ADC device 100 includes input terminal 104 configured to receive an input analog signal (A). In various embodiments, TI ADC device 100 includes four to six individual ADC units, although the present disclosure may be used to correct the output of TI ADC devices 100 having two or more individual ADC units. TI ADC device 100 is configured to sample the input analog signal at a particular frequency ($f_s$) and convert the sampled analog value into a corresponding digital output value (e.g., a digital bit stream) that is output as a digital output signal (D) at output terminal 106.

Within TI ADC device 100 each ADC unit 102 has an input terminal 108 configured to receive the input analog signal A. Each ADC unit 102 is configured to sample the analog input signal A and convert the sampled analog value into a digital value that is output at terminals 110 as digital signal D. The ADC units 102 are configured to sample the input analog signal at a frequency $f_u$ that is less than $f_s$. In implementations of TI ADC device 100, $f_u$ is equal to $f_s/N$.

Each ADC unit 102 has an input switch 112 and an output switch 114 enabling different individual ADC units 102 to be connected to the input terminal 104 and output terminal 106 so that the output of TI ADC device 100 at terminal 106 is generated by different ADC units 102 at different times. Essentially, each input switch 112 and output switches 114 provides a mechanism by which a specific ADC unit 102 of the several ADC units 102 can be "enabled" such that only that ADC unit 102's output is output at output terminal 106. As would be apparent to a person of ordinary skill in the art, other approaches may be implemented to allow a specific ADC unit 102 to be enabled (i.e., to be the ADC unit 102 that is generated the output value of TI ADC device 100), while the other ADC units 102 in TI ADC device 100 are disabled. In various implementations of TI ADC device 100 an ADC unit 102 that is disabled may still be operational (i.e., generating an output signal), but the output of the disabled ADC unit 102 is not being transmitted as the output of TI ADC device 100.

The outputs of the individual ADC units 102 are time interleaved to achieve the higher sampling frequency $f_s$ of the TI ADC device 100. When implementing time interleaving at the frequency $f_s$ with a corresponding sampling period $T_s=1/f_s$, TI ADC device 100 is initially configured (e.g., by a controller configured to manipulate input switches 112 and output switches 114) so that the first ADC unit 102 (ADC1) is enabled and receives the input analog signal at time t0 and converts the analog signal into an n-bit digital value, which is outputted at output terminal 106. At this time, the controller disables the other ADC units 102. $T_s$ seconds later, the controller adjusts input switches 112 and output switches 114 to enable the second ADC unit 102 (ADC2) with a connection to input terminal 104 and output terminal 106 and the second ADC unit 102 converts the sampled signal (i.e., at time $T_s$) into a second n-bit digital representation, which is output at output terminal 106. At this time, the other ADC units 102 are disabled. $T_s$ seconds later, the controller adjusts input switches 112 and output switches 114 to enable the third ADC unit 102 (ADC3) to sample the input analog signal (i.e., at time Ts*2) and generate a corresponding digital output at output terminal 106. At this time, the other ADC units 102 are disabled. This process continues until the last ADC unit 102 (ADCN) has sampled the input analog signal and generated a corresponding digital output at output terminal 106. The next sampling cycle starts with the first ADC unit 102 (ADC1) sampling the input signal and the process continues.

As the digital outputs at output terminal 106 become sequentially available in the same order as just described for the sampling operation, the digital values are recombined as a data stream with sample rate $f_s$. So, while the individual ADC units 102 are only being sampled at a frequency of $f_s/N$, the overall operation of TI ADC device 100 is equivalent to a single ADC sampling at $f_s$. In short, the input analog signal is broken into different ADC time slices that are separately processed by the individual ADC units 102 and then reassembled at the output to form a high data rate digital representation of the input analog signal.

Because, in any real-world TI ADC device 100, each individual ADC unit 102 will exhibit slightly different gain and offset errors, those errors will be passed on to the output of TI ADC device 100.

Figure 2:
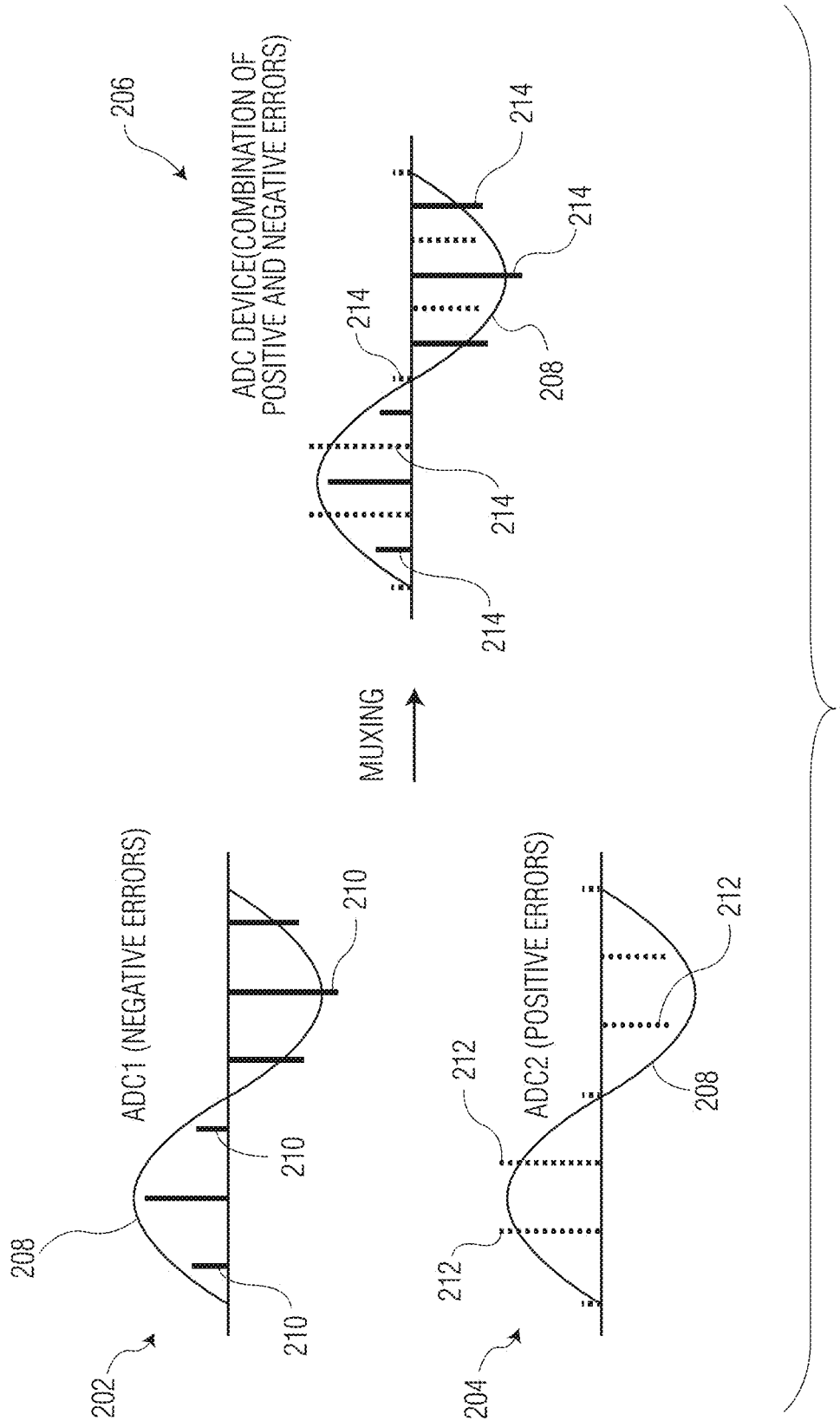
FIG. 2 shows a number of charts depicting errors that may be introduced by ADC conversions performed by different ADC units within a TI ADC device.

To illustrate, FIG. 2 shows a number of charts depicting errors that may be introduced by the ADC conversions performed by different ADC units 102 within TI ADC device 100, where the ADC units 102 have different gain and offset errors. Chart 202 depicts the ADC conversion performed by a first ADC unit 102 in TI ADC device 100 (e.g., ADC1), while chart 204 depicts the ADC conversion performed by a second ADC unit 102 in TI ADC device 100 (e.g., ADC2). Chart 206 depicts the output generated by TI ADC device 100 (e.g., combining the outputs of ADC1 and ADC2). In each chart 202, 204, and 206, the horizontal axis represents time, while the vertical axis represents a signal magnitude, whether digital or analog.

An analog signal 208 is depicted in each chart 202, 204, and 206, where the analog signal 208 represents the analog input (A) to TI ADC device 100. The various vertical bars depicted in each of charts 202, 204, and 206 represent digital values that are generated by the first ADC unit 102, the second ADC unit 102, and the TI ADC device 100, respectively. In an ideal ADC, the vertical bars (or digital values) would have a magnitude the matches the analog signal exactly.

As shown by chart 202, the first ADC unit 102 is characterized by gain and offset errors that result in the first ADC unit 102 tending to generate output digital values 210 that represent analog values slightly below the actual values of analog signal 208. Accordingly, the first ADC unit 102 is generally characterized by negative offset errors although the device may further exhibit other non-linear errors, as described herein. Similarly, the second ADC unit 102 is characterized by gain and offset errors that result in the second ADC unit 102 generating output digital values 212 that represent analog values slightly above the actual values of analog signal 208. Accordingly, the second ADC unit 102 is generally characterized by positive offset errors although the device may further exhibit other non-linear errors, as described herein.

As depicted by the digital values 214 output by TI ADC device 100, which represent the time-interleaved combinations of the digital values 210 and 212, generated by the first and second ADC units 102, include both the positive and negative offset errors that were generated by the first and second ADC units 102.

In addition to the offset errors generated by the individual ADC units, the time-interleaved digital output of TI ADC device 100 may further include additional spurious content, termed "interleaving spurs." Interleaving spur artifacts are generally a time-domain error that can be introduced by analog impairments in the communication channels of TI ADC device 100 that, due to the interleaving process, modulate with the sliced converted signals generated by each ADC unit 102 and ultimately show up in the final digitized output.

In addition to these types of errors and noise, the performance and accuracy of the individual ADC units 102 may be affected by process-voltage-temperature (PVT) factors that result in error offsets between the ADC units 102. In these types of variations, process variations account for deviations in the semiconductor fabrication process of components of components of the ADC units 102. Process variations may be due to variations in the manufacturing conditions such as temperature, pressure, and dopant concentrations. Various voltages (e.g., supply voltage, reference voltage, bias condition on a device) utilized within the various ICs making up TI ADC device 100 can vary from the established designed value during day-to-day operation and also over its lifetime, which can affect the operation of circuit components of the ADC units 102 in TI ADC device 100. Similarly, when the device is operating, temperature fluctuations can affect operational parameters of various circuit components.

To compensate for these and other errors, which may not be consistent across all ADC units 102 in TI ADC device 100, the present disclosure provides an ADC implementation in which a neural network that has been trained to "know" what the analog-to-digital conversion errors of each individual ADC units 102 are, and also to "know" how to compensate for those errors. As referred to herein, analog-to-digital conversion errors may be any type of distortion caused by circuitry within the ADC units 102 that results in the digital output signal of TI ADC device 100 not being a true or "ideal" digital conversion of the input analog signal. Such analog-to-digital conversion errors may be caused by non-linearities within the ADC circuitry, or any other defects or processing parameters that can produce such ADC errors, which may take the form of noise, distortion, harmonics, etc. TI ADC device 100 may be any type of time-interleaved ADC implemented within any type of device or circuitry that utilizes an ADC. The neural networks described herein may be implemented with any type of hardware and/or software (as will be further disclosed herein), such as within an appropriate set of digital circuitry suitable for implementation of a neural network. The illustration of the neural networks within the figures is not to be limiting upon the scope of embodiments of the present disclosure. Within the various figures, "(A)" represents that the signal is an analog signal, and "(D)" represents that the signal is a digital signal.

Figure 3A:
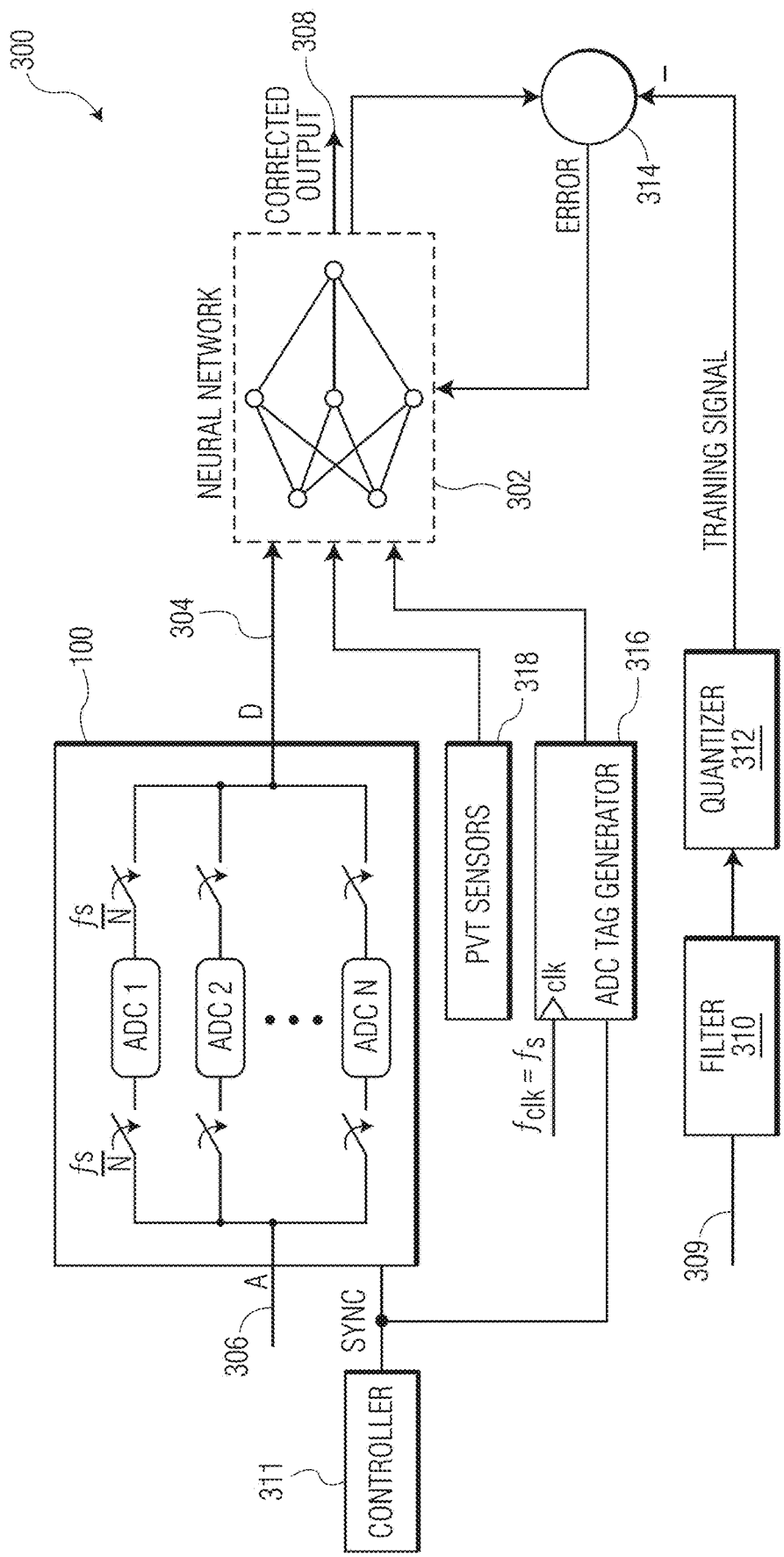
FIG. 3A depicts a system configured to enable training of a neural network based on an input target signal to correct ADC unit-specific errors within a TI ADC device.

FIG. 3A is a block diagram depicting components of a system 300 that incorporates a TI ADC device 100 (e.g., TI ADC device 100, FIG. 1) and neural network 302 configured to provide active correction of the output signal of TI ADC device 100 to compensate for errors generated by the individual ADC units 102 therein. TI ADC device 100 is connected to controller 311. Controller 311 is configured to transmit control signals to TI ADC device 100 to sequentially enable the individual ADC units 102 of TI ADC device 100 at a frequency of $f_s$ enabling TI ADC device 100 to generate a time-interleaved output at terminal 304 having a sampling rate $f_s$, while the N individual ADC units 102 are only sampled at a rate of $f_s/N$. In an embodiment, neural network 302 may have a relatively small number of neurons and interconnections enabling neural network 302 to be implemented using low-cost hardware solutions. In one example, neural network 302 may have fewer than 3 layers, with fewer than 10 neurons in each layer (e.g., a 2×5 neural network having 2 layers, each with 5 neurons). FIG. 3A shows system 300 in a configuration enabling training of neural network 302 based on an input training signal.

Figure 4:
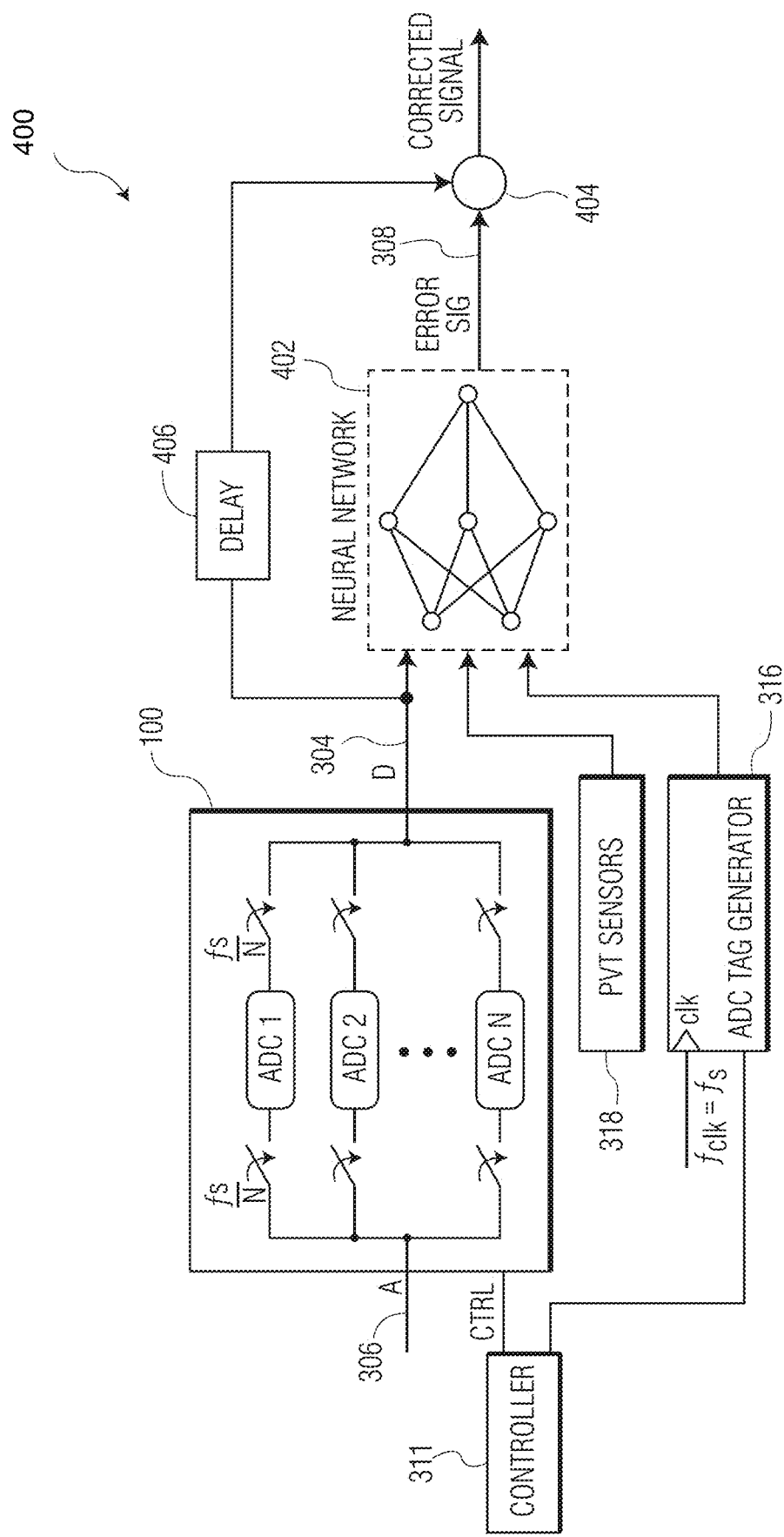
FIG. 4 depicts a system including a neural network configured to generate an error correction signal configured to correct ADC unit-specific errors within a TI ADC device.

System 300 is configured to receive an input analog signal at input terminal 306, take a sample of that input analog signal and generate an output digital signal at terminal 304. Neural network 302, as described below, is configured to apply an appropriate correction scheme to generate an output signal that can be used to modify the output digital signal at terminal 304 to generate a corrected digital signal, which is output at node 308. In some embodiments, this may involve neural network 302 applying the correction scheme and outputting the corrected signal itself, as depicted in FIG. 3A. In other embodiments (and as shown in FIG. 4), however, neural network 302 may be configured to use the correction scheme to generate an error signal that can be applied to the output of TI ADC device 100 (e.g., via subtraction) to correct the output of TI ADC device 100.

Neural network 302 is trained using training signals that represents a known analog input signal and the corresponding "ideal" digital signal that represent an accurate conversion of the known analog input signal into a digital signal stream. Specifically, the known analog training signal is supplied at input terminal 306. At the same time, the training digital signal is supplied to digital training signal input 309. During training of neural network 302, TI ADC device 100 processes the known analog input signal to generate a corresponding digital output signal. The output of TI ADC device 100 is fed through neural network 302 and the output of neural network 302 (i.e., the "corrected" TI ADC device 100 output signal) is then compared to the digital training signal received at input 309. If TI ADC device 100 were operating without errors and/or neural network 302 was accurately trained to correct all errors, the two signals would be equal with zero error. However, because TI ADC device 100 will introduce some errors into its output signal that, while neural network 302 is being trained, neural network 302 does not accurately correct, that error (e.g., determined by determining the different between the output of neural network 302 and the digital training signal) is fed back into neural network 302 enabling neural network 302 to develop more accurate error correction schemes.

In various embodiments, the training digital signal may be filtered through digital filter 310, which can be configured to filter out harmonics and excessive noise in the training digital stream. The output of the filter 310 therefore represents an "ideal" digital signal that normally would be produced by a reference ADC that produces fewer conversion errors than TI ADC device 100. In some embodiments, while training neural network 302, a delay element may be positioned between output terminal 304 of TI ADC device 100 and neural network 302 to compensate for any delays (e.g., propagation delays) inherent in the operation of filter 310. In still other embodiments, an optional quantizer 312 may be introduced after filter 310 to reduce a number of bits in the output signal of filter 310 if filter 310 has large word widths. Quantizer 312 may be any device that is configured to perform a desired quantization (e.g., truncating, rounding, scaling, establish a highest or lowest number of bits, etc.). In accordance with alternative embodiments of the present disclosure, one or more quantizers may be used throughout the system to limit word widths in digital data streams.

In accordance with certain embodiments of the present disclosure, neural network 302 is trained by an error signal ('ERROR'), which is a difference between the output signal from neural network 302 and the ideal signal generated by filter 310 and/or optional quantizer 312.

To accomplish this, the training digital signal (e.g., filtered by filter 310 and processed by optional quantizer 312) is subtracted from the corrected output signal output by neural network 302 by comparator 314. The error signal produced by that comparison is passed through a cost function used to train the neural network 302 (e.g., using a Levenberg-Marquardt algorithm, backpropagation (gradient descent) algorithm, or similar algorithms). Backpropagation computes the gradient in weight space of a feedforward neural network, with respect to a loss function. Using backpropagation, computational parameters (e.g., weights and/or biases) of the neurons of neural network 302 are adapted (e.g., following a steepest descent method, also known as gradient descent). However, any suitable cost function and training algorithm may be utilized for training the neural network.

This training phase of neural network 302 may be performed continuously, or repeatedly, until the corrected output signal of neural network 302 at node 308 has minimum errors (or at least a desired set of fewer errors) as compared to the training digital signal.

In some embodiments, neural network 302 may be trained using a predetermined training signal that is directly retrieved from a memory storage location that is provided to both the TI ADC device 100 and the neural network. In that case, the training signal does not require quantization or filtering. As such, neural network 302 may be trained using locally available training information (e.g., "on chip" training data) rather than a training signal received from an external source.

To further refine this training approach, in system 300 an additional input is provided to enable the neural network 302 to identify which particular ADC unit 102 is responsible for generating the current digital value that is being output by TI ADC device 100 at output node 304. This additional information enables neural network 302 to be trained to implement corrective schemes that are customized for each individual ADC unit 102. Because the different ADC units 102 within TI ADC device 100 may exhibit unique error profiles, as described above, this additional information enables neural network 302 to establish different correction schemes for each ADC unit 102.

To enable this functionality, system 300 includes ADC tag generator 316 which is configured to transmit an identifier value to neural network 302, where the identifier identifies a particular ADC unit 102 of TI ADC device 100 that is currently enabled and responsible for generating the digital value that is being output by TI ADC device 100 at output node 304. Typically, the identifier value output by ADC tag generator 316 will be a digital value identifying the ADC unit 102. In a TI ADC device 100 with six ADC units 102, for example, the identifier values output by ADC tag generator 316 may be the binary values 000, 001, 010, 011, 100, and 101 for example. The identifier values are processed by neural network 302 along with the input digital data stream generated by TI ADC device 100 to enable neural network 302 to learn custom error correction schemes specific to the particular ADC unit 102 that is enabled.

To provide synchronized operation, ADC tag generator 316 receive a clock signal input having frequency $f_s$ enabling ADC tag generator 316 to coordinate the transmission of ADC tag identifiers with the times at which the identified ADC unit 102 is enabled within TI ADC device 100

Specifically, when controller 311 initiates the operation of TI ADC device 100 (e.g., by enabling the operation of a first ADC unit 102 of TI ADC device 100) controller 311 is configured to transmit a synchronization signal to ADC tag generator 316 to inform ADC tag generator 316 that TI ADC device 100 has begun operation and that the first ADC unit 102 has been enabled. At that time ADC tag generator 316 is configured to output an ADC unit identifier output signal that identifies the first ADC unit 102 that is currently enabled. Going forward, ADC tag generator 316 is configured to use the clock signal to generate ADC unit identifier output signals that identify which particular ADC unit 102 is currently enabled within TI ADC device 100.

Specifically, when TI ADC device 100 has N individual ADC units 102, ADC tag generator 316 is configured to, upon receipt of the sync signal from controller 311 (indicating that operation of TI ADC device 100 has been initiated) ADC tag generator 316 is configured to generate an output indicating the first ADC unit 102 has been enabled. When the clock signal toggles for the first time following receipt of the sync signal (at which time controller 311 enables the second ADC unit 102 of TI ADC device 100), ADC tag generator 316 is configured to generate an output indicating the second ADC unit 102 has been enabled. When the clock signal toggles for the second time following receipt of the sync signal (at which time controller 311 enables the third ADC unit 102 of TI ADC device 100), ADC tag generator 316 is configured to generate an output indicating the third ADC unit 102 has been enabled. ADC tag generator 316 continues operating in this manner in which ADC tag generator 316 sequentially identifies ADC units 102 with each clock signal toggle until ADC unit 102 N is enabled, at which time ADC tag generator 316 returns, at the next clock signal toggle, to identifying the first ADC unit 102. The process then continues with ADC units 102 within TI ADC device 100 being sequentially enabled and ADC tag generator 316 outputting, in synchronicity, the identifier of the ADC unit 102 that is currently enabled.

Accordingly, in system 300, ADC tag generator 316 generates N unique tag identifier values, and outputs those values in a cyclic fashion that is coordinated with the algorithm for iterating through and sampling the various ADC units 102 of TI ADC device 100, at a rate equal to the sampling frequency $f_s$.

Consequently, each digital output sample from TI ADC device 100 that is provided to neural network 302 is tagged with the identifier of that data sample's originating ADC unit 102. This, in turn, notifies the neural network 302 of which ADC unit 102 is responsible for generating which output data value. If the neural network is aware of the ADC unit 102 that produced each specific output value, neural network 302 thereby gains the ability to compensate the unique errors generated by that specific ADC unit 102.

In accordance with certain embodiments of the present disclosure, one or more PVT sensor 318 may optionally be incorporated into system 300 to provide PVT parameters to neural network 302 so that the neural network 302 can further modify the output of the TI ADC device 100 to correct for PVT variations. As a result, as neural network 302 is trained, its cost function will take into account the PVT effects on the errors caused by such processing inputs to be utilized for adjusting the weights and/or biases within the nodes of the neural network 302.

In accordance with various embodiments of the present disclosure any type of process related information could be added as a PVT Input to the neural network 302, such as various technology parameters (e.g., electron mobility, transistor parameters (e.g., Vt, fT, Beta, doping), resistor parameters (e.g., nominal resistor value, voltage dependency), or capacitor parameters (e.g., nominal capacitor value, voltage dependency). As long as there is a manner in which to measure a process related parameter, then the output of this measurement can be provided as a PVT Input to the neural network 302.

Figure 3B:
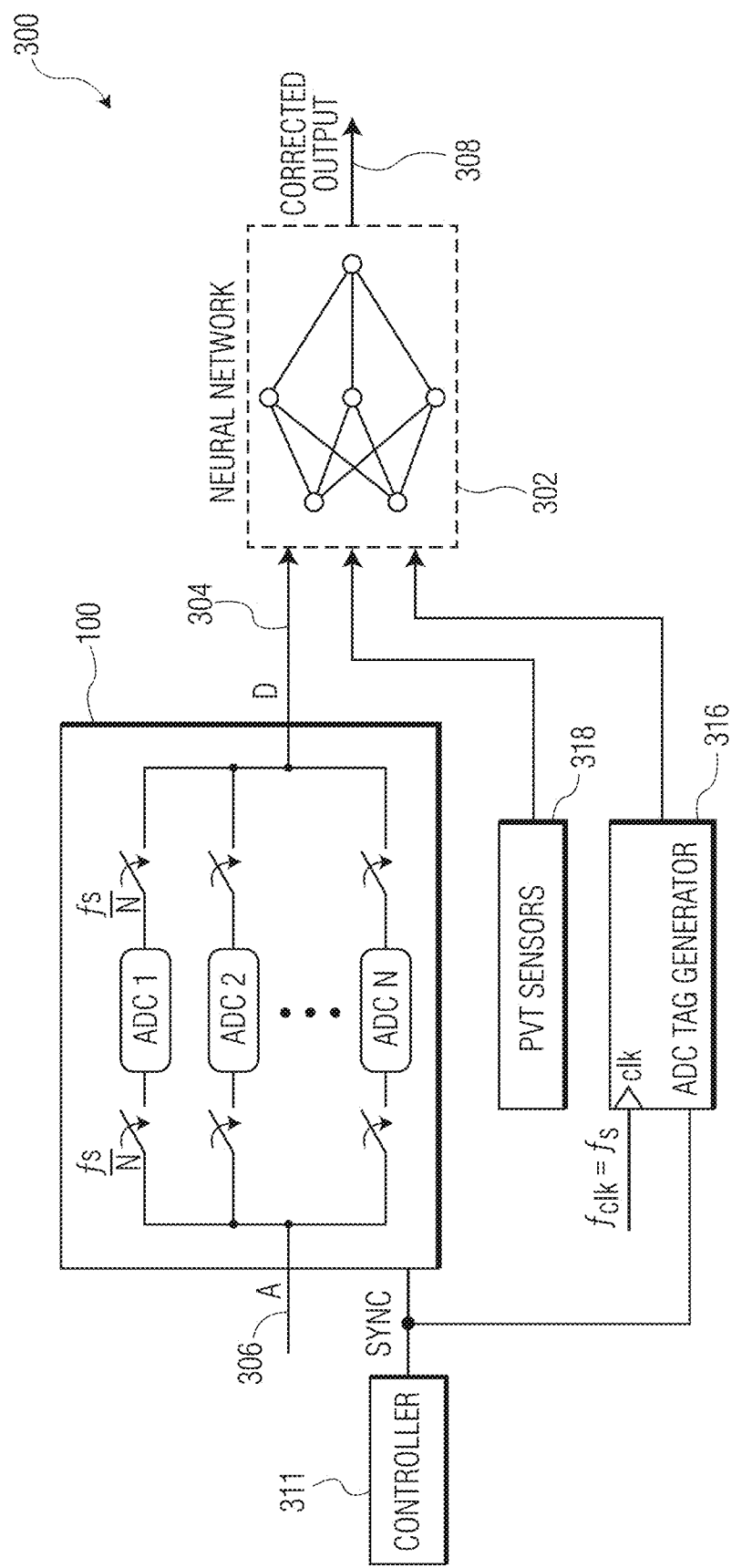
FIG. 3B depicts the system of FIG. 3A configured in a production or active configuration for incorporation into an end-use application.

With neural network 302 trained in accordance with the training protocol despite in FIG. 3A and described above, FIG. 3B depicts system 300 in a production or active configuration for incorporation into an end-use application. With reference to FIG. 3B, neural network 302 has been trained and, as such, there is no need to receive the training digital input signal that was previously used to train neural network 302. Consequently, the signal path from digital training signal input 309 through filter 310 and optional quantizer 312 are removed. Similarly, no error signal feedback is required, so comparator 314 and its connections can be removed.

During normal operations, an analog input signal is applied to input terminal 306 of TI ADC device 100 and TI ADC device 100 produces a digital output signal at output terminal 304 that is then modified by the trained neural network 302 to produce a compensated or calibrated corrected output signal at node 308, which may be utilized by other circuitry or components coupled to output node 308. To enable neural network 302 to apply the appropriate error correction scheme to correct the output of TI ADC device 100, ADC tag generator 316 notifies neural network 302 of the specific ADC unit 102 that was responsible for generating the output being corrected by neural network 302. Similarly, one or more PVT sensor 318 provides a PVT input to neural network 302 enabling neural network 302 to apply specific corrections to compensate for PVT conditions the ADC units 102. Upon receipt of the ADC unit 102 identifier value, neural network 302 is trained to apply an error correction scheme that is customized to that particular ADC unit 102 to correct the digital output signal output by TI ADC device 100 and received by neural network 302.

Within system 300, ADC tag generator 316 may be implemented by any suitable circuitry or components configured to receive, as input, a clock signal having frequency $f_s$ and generate, in response, an output signal including an identifier value that may be used to identify a particular ADC unit 102 of TI ADC device 100.

ADC tag generator 316 is typically a digital circuit configured to associate data samples with specific ADC units of a TI ADC device to enable a neural network to correct the output while accounting for each ADC unit's individual error profile. In some cases, ADC tag generator 316 can be implemented as a binary counter configured to count through the total number N of ADC units 102 before resetting.

As discussed above, the embodiments of system 300 depicted in FIGS. 3A and 3B are implemented such that neural network 302 has been trained to process the output signal of TI ADC device 100 to generate a corrected signal that is output by neural network 302 as a corrected output signal at node 308. In other embodiments, however, neural network 302 may be configured to use the correction scheme to generate an error signal or correction signal that can be applied to the output of TI ADC device 100 (e.g., via subtraction) to correct the output of TI ADC device 100.

FIG. 4 depicts system 400 that includes neural network 402 configured to generate an error correction signal configured to correct ADC unit-specific errors within a TI ADC device. System 400 is configured in a similar manner to system 300 depicted in FIGS. 3A and 3B and described above. As such, components of system 400 with element numbers contained within FIGS. 3A and 3B are equivalent to and are as described above. During operation, neural network 402 analyzes the output of TI ADC device 100 and, in combination with the ADC unit 102 identifier information received from ADC tag generator 316, neural network 402 is configured to calculate an error signal that represents the difference between the actual output of TI ADC device 100 and the desired or ideal output. Neural network 402 is configured to output that error signal to summing node 404.

At the same time, the output of TI ADC device 100 is provided to summing node 404 through an optional delay element 406. Optional delay element 406 is any suitably configured circuit component configured to delay transmission of the output signal of TI ADC device 100 to node 404 by a time delay equal to the time delay of a signal passing through neural network 402. In this manner, the raw output of TI ADC device 100 and the error signal generated by neural network 402 reach summing node 404 at substantially the same time. Summing node 404 is then configured to subtract the error signal from the raw output signal of TI ADC device 100 to generate the corrected output signal.

Figure 5A:
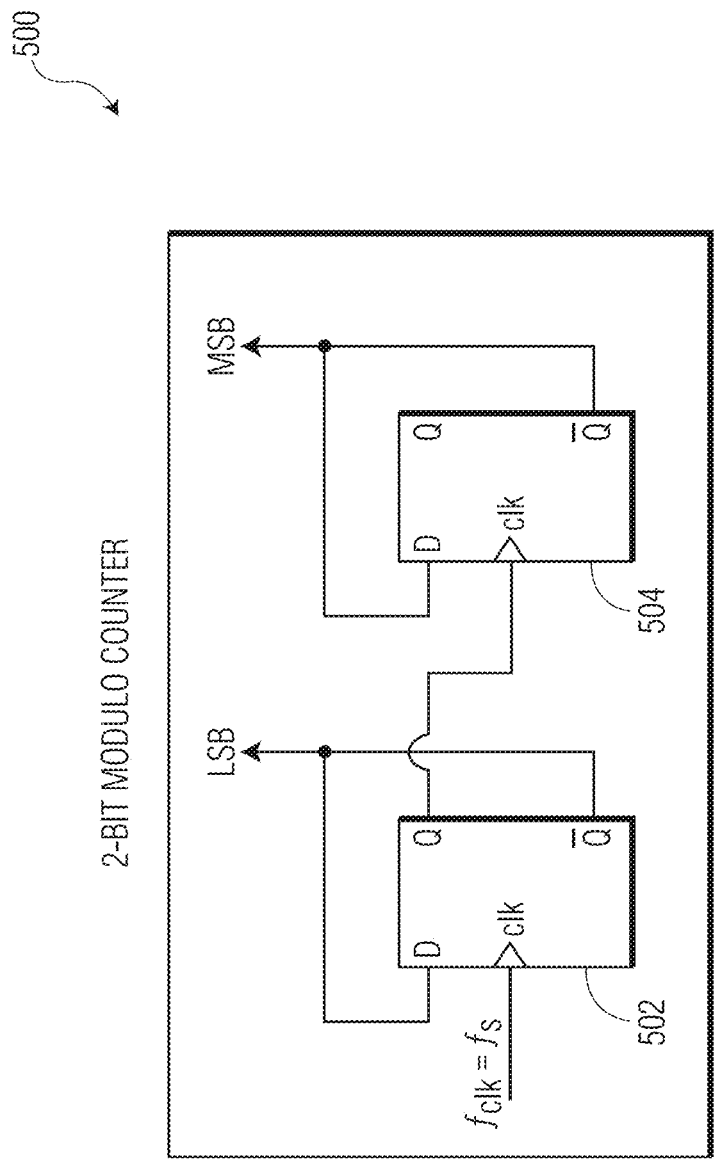
FIGS. 5A and 5B are schematics depicting example implementations of an ADC tag generator.
Figure 5B:
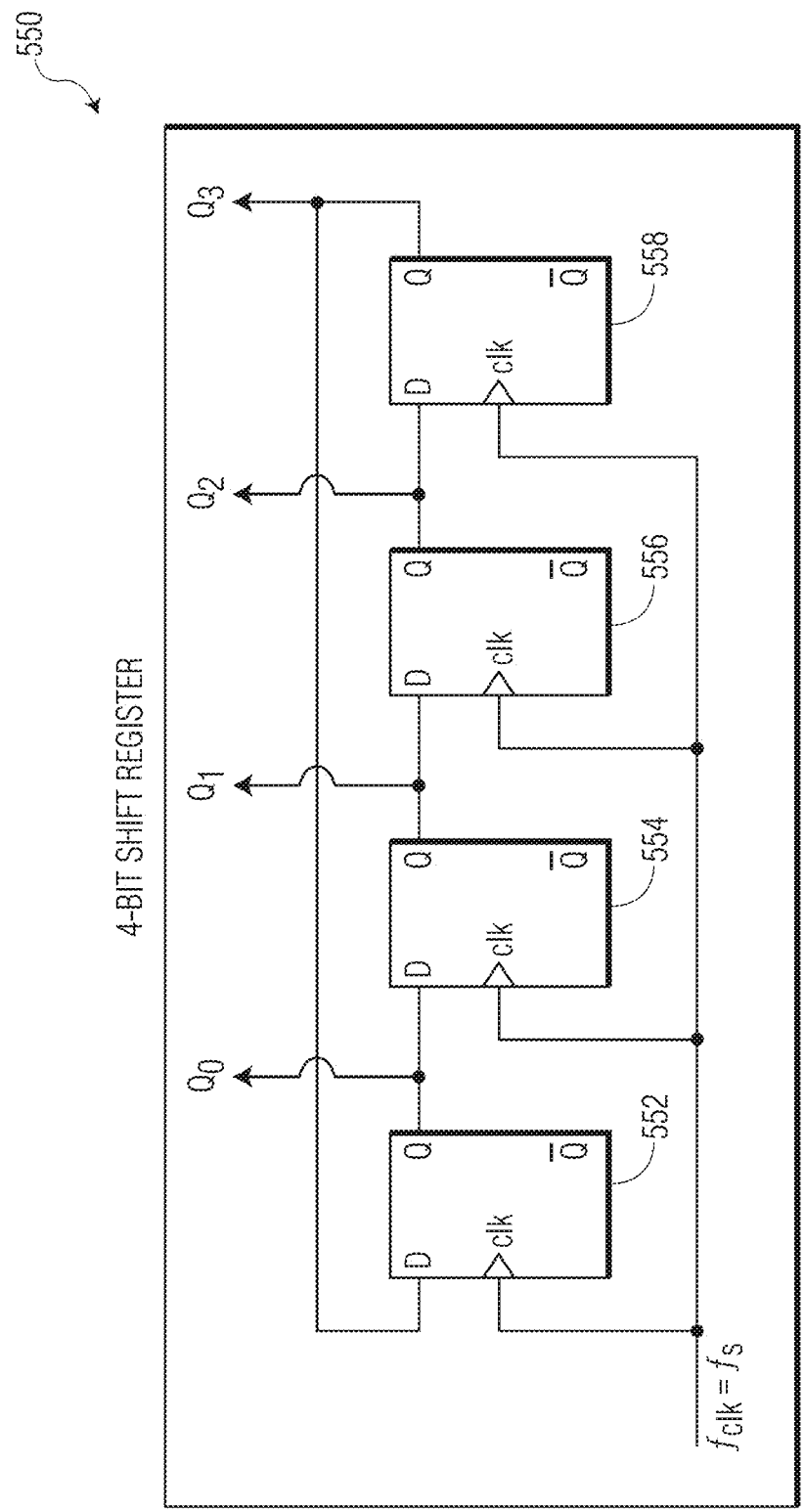

FIGS. 5A and 5B are schematics depicting example implementations of ADC tag generator 316. In FIG. 5A, ADC tag generator 500 is implemented as a modulo-N counter (FIG. 5A depicts a modulo-4 counter), where N is the number of ADC units 102 in the TI ADC device 100. In the modulo-4 counter configuration, ADC tag generator 500 includes two flip-flops, flip flop 502 and flip flop 504. The clock input terminal (clk) of flip flop 502 receives the clock signal having frequency $f_s$ as an input. The data input terminal (D) and the inverted output terminal ($\overline{Q}$) of flip flop 502 are tied to one another and represent the output of the least significant bit (LSB) of the counter. The non-inverted output terminal (Q) of flip flop 502 is connected to the clock input terminal (clk) of flip flop 504. The data input terminal (D) and the inverted output terminal ($\overline{Q}$) of flip flop 504 are tied to one another and represent the output of the most significant bit (MSB) of the 2-bit counter of ADC tag generator 500.

As the clock signal input to ADC tag generator 500 toggles, the output of ADC tag generator 500 will count through binary values from a lowest value of zero up to a maximum binary value of 11 (i.e., the value 3) or N-1, where N is the number of ADC units 102 in the TI ADC device 100. The LSB and MSB values are supplied to neural network 302 as the ADC unit identifiers to enable neural network 302 to identify the specific ADC unit 102 generating data being process by neural network 302.

In FIG. 5B, ADC tag generator 550 is implemented as an n-bit shift register. In the example depicted in FIG. 5B, n is equal to 4. ADC tag generator 550 is made up of four flip flops 552, 554, 556, and 558.

The clock input terminals (clk) of each flip flop 552, 554, 556, and 558 receives the clock signal having frequency $f_s$ as an input. The data input terminal (D) of flip flop 552 is connected to the non-inverting output terminal (Q) of flip flop 558. The non-inverting output terminal (Q) of flip flop 552 is connected to the data input terminal (D) of flip flop 554. The non-inverting output terminal (Q) of flip flop 554 is connected to the data input terminal (D) of flip flop 556. The non-inverting output terminal (Q) of flip flop 556 is connected to the data input terminal (D) of flip flop 558.

As the clock signal toggles, a high output value (e.g., a binary value of '1') transitions from being output at terminal $Q_0$ to $Q_1$, $Q_2$ and, eventually $Q_3$, where the other output terminals are set to low output values (e.g., a binary value of '0'). Upon a further clock toggle, the '1' value returns to being output at terminal $Q_0$ and the process continues.

The output values $Q_0$, $Q_1$, $Q_2$, and $Q_3$ are supplied to neural network 302 as the ADC unit 102 identifier to enable neural network 302 to identify the specific ADC unit 102 generating data being processed by neural network 302.

As described herein, the present disclosure provides an improved TI ADC system in which an error correction system (e.g., a neural network) is configured to make corrections in the TI ADC system to correct ADC conversions occurring in the individual ADC units of the TI ADC system. Specifically, the error correction system is configured to receive an input that indicates which of the several ADC units are enabled (and actively transmitting a digital value to the output of the TI ADC system) and then apply an error correction scheme that may be unique to that specific ADC unit. In this manner, improved error correction can be enabled.

Figure 6A:
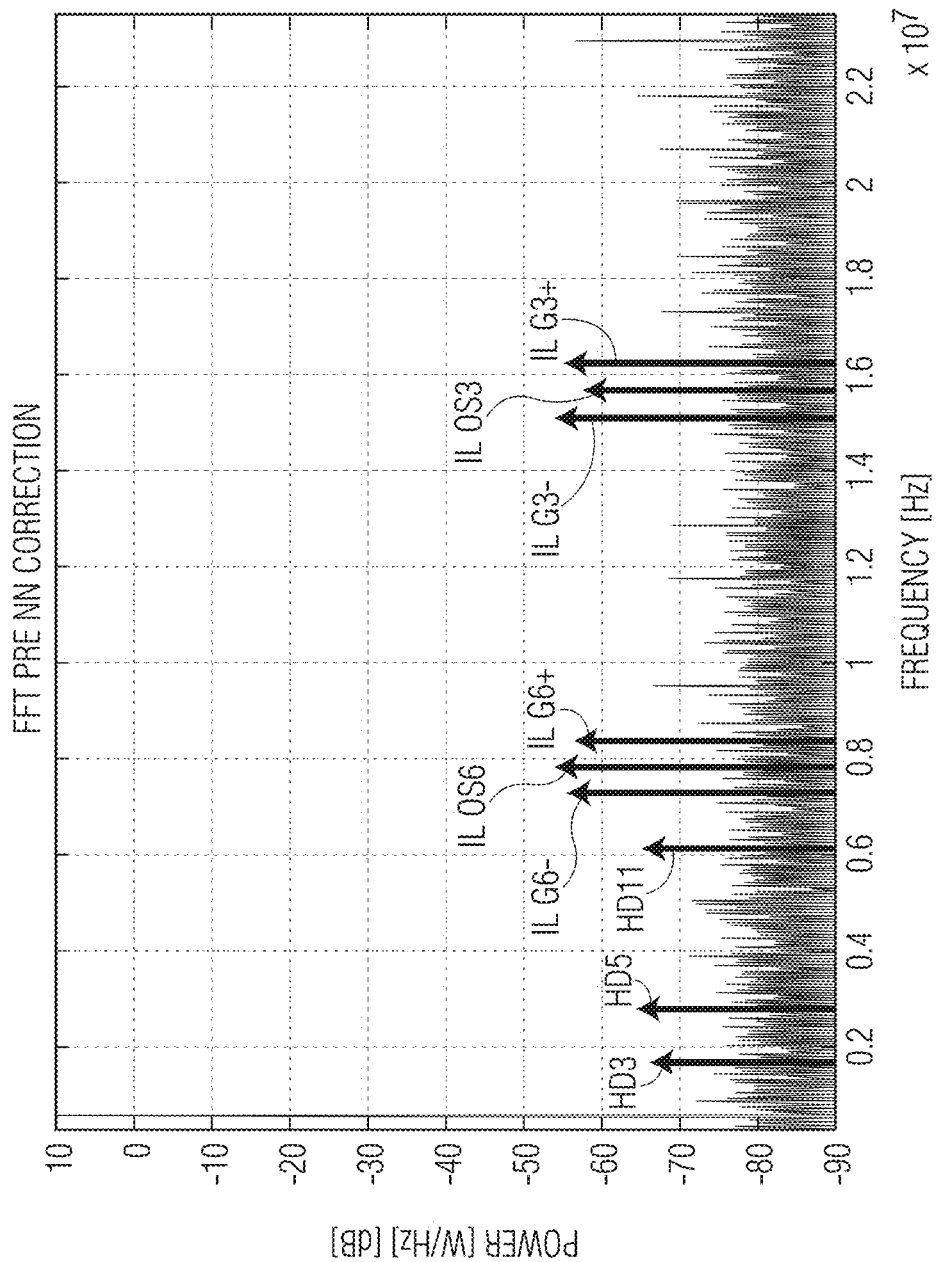
FIG. 6A is a chart depicting the frequency spectrum of an output signal of a conventional TI ADC device.

To illustrate, FIG. 6A is a chart depicting the frequency domain output of a fast Fourier transform (FFT) of the output signal of a conventional TI ADC device as applied to an analog input signal. The horizontal axis represents frequency while the vertical axis represents magnitude. Errors created by time-interleaving, which can be referred to as 'IL-spurs' (Interleaving Spurs) occur at fixed frequencies (for sinusoidal inputs) and are apparent at the raised peaks within FIG. 6A. In general, a TI ADC with N ADC units creates these offset spurs at $fos=(k/N)f_s$, where k is a non-negative integer (0, 1, 2, 3, etc. . . . ). The corresponding gain spurs can be found at $f_G=(k/N)f_s \pm f_{in}$.

For example, if a particular TI ADC device as N=6 ADC units, the offset spurs will appear at: f=0, $f=f_s/6$, $f=f_s/3$, $f=2f_s/3$ (aliases to $f_s/3$), $f=5f_s/6$ (aliases to $f_s/6$). In FIG. 6A, a spectrum of a TI ADC with interleaving factor 6 is displayed. The spurious content related to time-interleaving is highlighted can be found at the characteristic frequencies as discussed above. In this example, fs=47 MHz and fin=559 kHz.

Figure 6B:
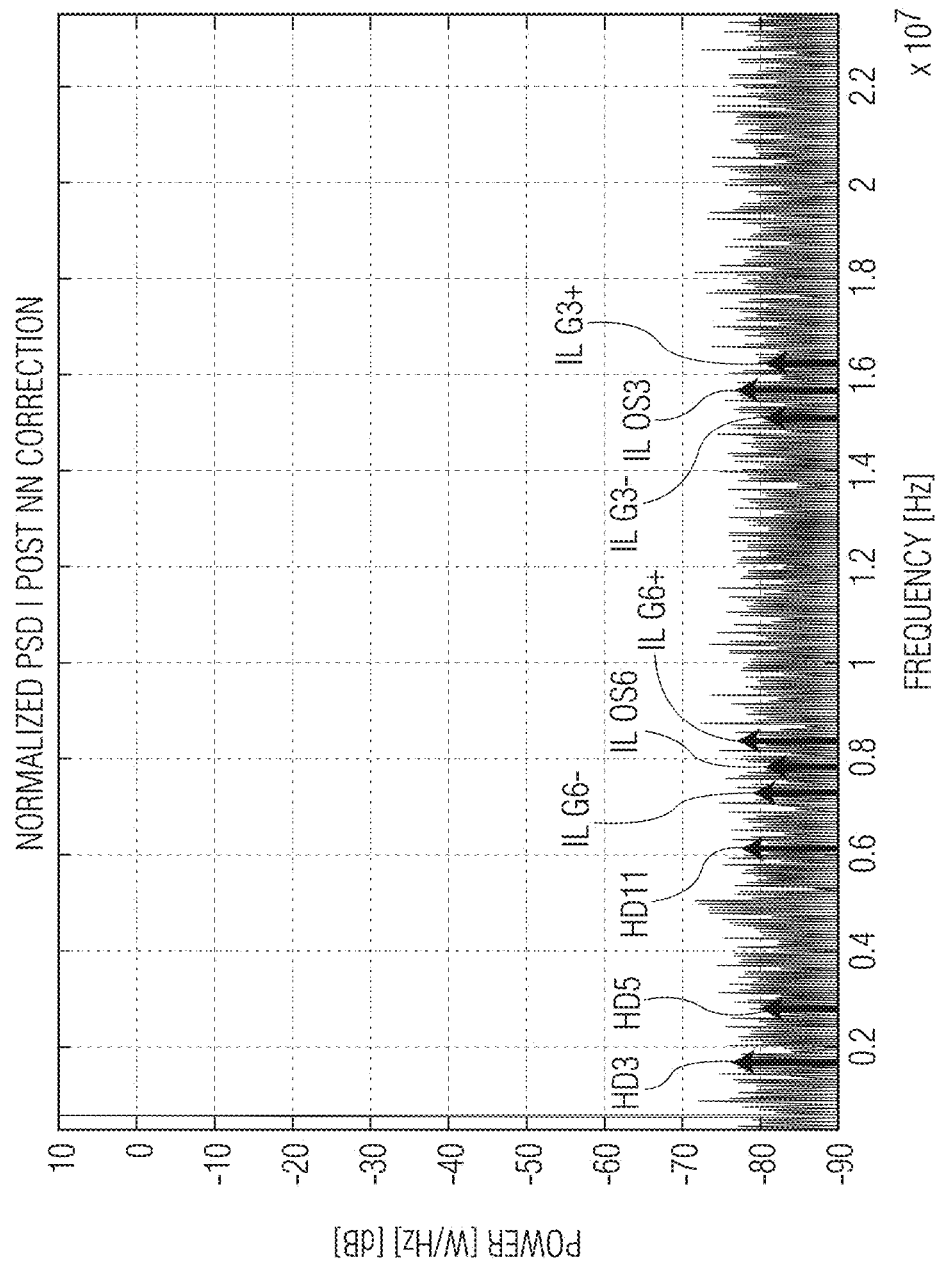
FIG. 6B is a chart depicting the frequency spectrum of an output signal of a system configured in accordance with the present disclosure.

FIG. 6B shows the same output with corrections applied by an error correction system (e.g., neural network 302) configured in accordance with the present disclosure. Specifically, the error correction system has been trained using ADC unit identifier generated by an ADC tag generator (e.g., ADC tag generator 316). This enables the error correction system to apply error correction that is tailored to the specific errors (gain, offset, or otherwise) generated by each individual ADC units. As a consequence, time-interleaving spurs in the output of the TI ADC device can be corrected. As seen in FIG. 6B, the magnitude of those IL-spurs has been greatly reduced indicating a significant reduction in errors in the corrected TI ADC device output.

As has been described herein, various embodiments of the present disclosure implement a machine learning system configured to compensate for ADC errors in specific ADC units of a TI ADC device. Such a machine learning system may be implemented within hardware and/or software, such as within one or more data processing systems. Nevertheless, the functionalities described herein are not to be limited for implementation into any particular hardware/software platform.

Figure 7:
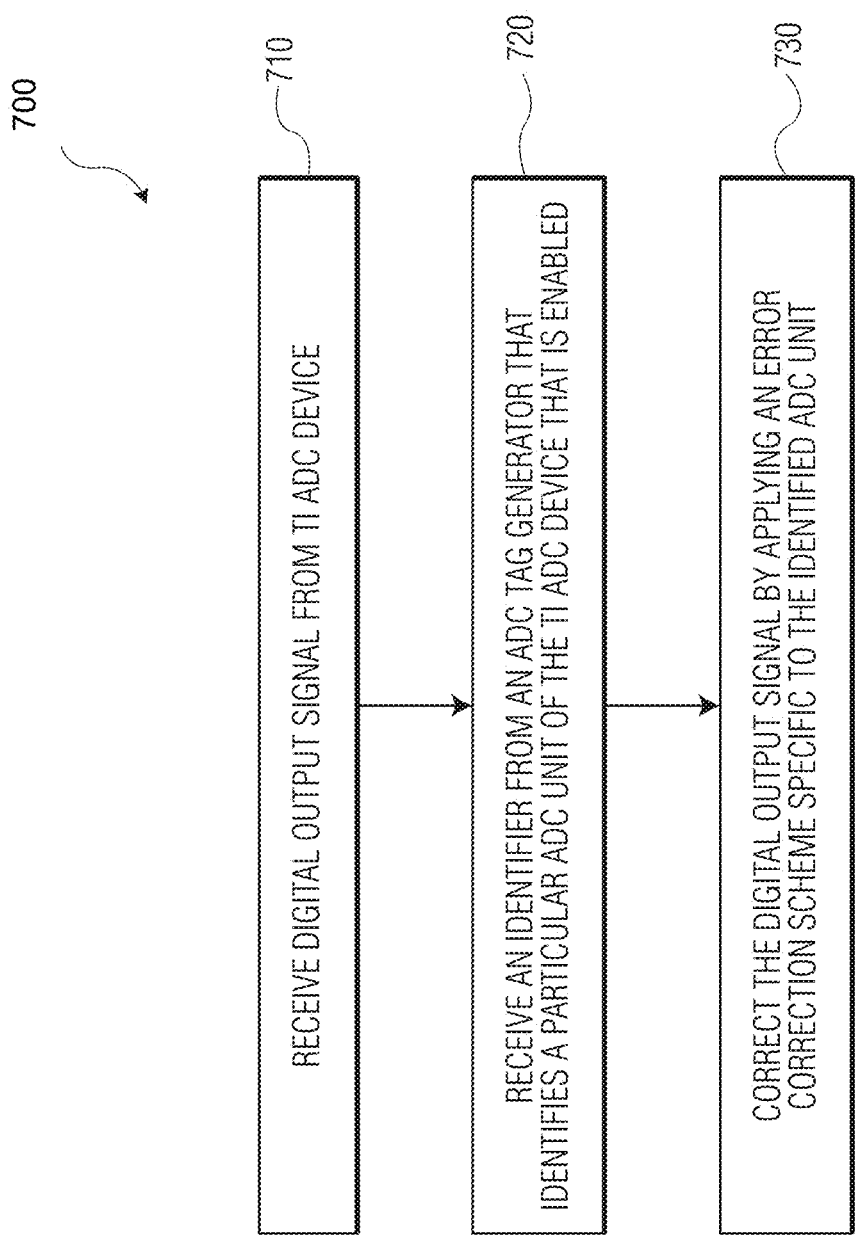
FIG. 7 is a flow chart depicting a method for correcting an output of a TI ADC device by applying ADC unit-specific corrections.

FIG. 7 is a flowchart of an example method 700 for correcting an output of a TI ADC device by applying ADC unit-specific corrections. Method 700 may be implemented by any suitable error correction system (e.g., neural network 302 of FIGS. 3A, 3B, and 4) that is connected to the output of the TI ADC device and configured to receive an input specifying which particular ADC unit is enabled within the TI ADC device. At step 710, the error correction system receives a first digital output signal from TI ADC device (e.g., TI ADC device 100). As described herein the TI ADC device includes a number of individual ADC units (e.g., ADC units 102), which are configured to measure a magnitude of an input signal and output a digital value corresponding to the input signal magnitude.

At step 720, the error correction system receives a first identifier from an ADC tag generator. The first identifier identifies a particular ADC unit out of the plurality of ADC units that is enabled and currently generating the digital output signal of the overall TI ADC device. Having received that first identifier information, the error correction system, at step 730, modifies the first digital output signal to generate a first corrected digital output signal by compensating for first analog-to-digital conversion errors occurring within the first ADC by applying a first error correction scheme that is associated with the first ADC.

After that ADC unit has finished sampling its input signal, that ADC unit is disabled and another ADC unit of the TI ADC device is enabled. At that time, the error correction system receives a signal identifying the second ADC unit and begins applying an error correction scheme specific to that ADC unit. This process continues until all N ADC units contained with the TI ADC device have been sequentially enabled (with the neural network applying appropriate error correction for each individual ADC unit). The process then repeats with the first ADC unit of the plurality of ADC units being enabled.

As will be appreciated by one skilled in the art, aspects of the present disclosure may be embodied as a system, process, method, and/or program product. Accordingly, various aspects of the present disclosure (e.g., the machine learning system) may take the form of an entirely hardware embodiment, an entirely software embodiment (including firmware, resident software, micro-code, etc.), or embodiments combining software and hardware aspects, which may generally be referred to herein as a "circuit," "circuitry," "module," or "system." Furthermore, aspects of the present disclosure may take the form of a program product embodied in one or more computer readable storage medium(s) having computer readable program code embodied thereon. (However, any combination of one or more computer readable medium (s) may be utilized. The computer readable medium may be a computer readable signal medium or a computer readable storage medium.)

A computer readable storage medium may be, for example, but not limited to, an electronic, magnetic, optical, electromagnetic, infrared, biologic, atomic, or semiconductor system, apparatus, controller, or device, or any suitable combination of the foregoing, wherein the computer readable storage medium is not a transitory signal per se. More specific examples (a non-exhaustive list) of the computer readable storage medium may include the following: an electrical connection having one or more wires, a portable computer diskette, a hard disk, a random access memory ("RAM"), a read-only memory ("ROM"), an erasable programmable read-only memory ("EPROM" or flash memory), an optical fiber, a portable compact disc read-only memory ("CD-ROM"), an optical storage device, a magnetic storage device, or any suitable combination of the foregoing. In the context of this document, a computer readable storage medium may be any tangible medium that can contain or store a program for use by or in connection with an instruction execution system, apparatus, controller, or device. Program code embodied on a computer readable signal medium may be transmitted using any appropriate medium, including but not limited to wireless, wire line, optical fiber cable, RF, etc., or any suitable combination of the foregoing.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, controller, or device.

The block diagrams in the figures illustrate architecture, functionality, and operation of possible implementations of circuitry, systems, methods, processes, and program products according to various embodiments of the present disclosure. In this regard, certain blocks in the block diagrams (e.g., neural network 302) may represent a module, segment, or portion of code, which includes one or more executable program instructions for implementing the specified logical function(s). It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Modules implemented in software for execution by various types of processors may, for instance, include one or more physical or logical blocks of computer instructions, which may, for instance, be organized as an object, procedure, or function. Nevertheless, the executables of an identified module need not be physically located together, but may include disparate instructions stored in different locations which, when joined logically together, include the module, and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules, and may be embodied in any suitable form and organized within any suitable type of data structure. The operational data may be collected as a single data set, or may be distributed over different locations including over different storage devices. The data may provide electronic signals on a system or network.

These program instructions may be provided to one or more processors and/or controller(s) of a general-purpose computer, special purpose computer, or other programmable data processing apparatus (e.g., controller) to produce a machine, such that the instructions, which execute via the processor(s) of the computer or other programmable data processing apparatus, create circuitry or means for implementing the functions/acts specified in the block diagram block or blocks.

It will also be noted that each block of the block diagrams, and combinations of blocks in the block diagrams, can be implemented by special purpose hardware-based systems (e.g., which may include one or more graphics processing units) that perform the specified functions or acts, or combinations of special purpose hardware and computer instructions. For example, a module (e.g., neural network 302) may be implemented as a hardware circuit including custom VLSI circuits or gate arrays, off-the-shelf semiconductors such as logic chips, transistors, controllers, or other discrete components. A module (e.g., neural network 302) may also be implemented in programmable hardware devices such as field programmable gate arrays, programmable array logic, programmable logic devices, application specific ICs, microcontrollers, systems on a chip, general purpose processors, microprocessors, or the like.

Computer program code, i.e., instructions, for carrying out operations for aspects of the present disclosure may be written in any combination of one or more programming languages, including an object-oriented programming language such as Java, Smalltalk, Python, C++, or the like, conventional procedural programming languages, such as the "C" programming language or similar programming languages, or any of the machine learning software disclosed herein.

These program instructions may also be stored in a computer readable storage medium that can direct a computer system, other programmable data processing apparatus, controller, or other devices to function in a particular manner, such that the instructions stored in the computer readable medium produce an article of manufacture including instructions which implement the functions/acts specified in the block diagram block or blocks.

The program instructions may also be loaded onto a computer, other programmable data processing apparatus, controller, or other devices to cause a series of operational steps to be performed on the computer, other programmable apparatus or other devices to produce a computer implemented process such that the instructions which execute on the computer, other programmable apparatus, or other devices provide processes for implementing the functions/acts specified in the block diagram block or blocks.

In some aspects, the techniques described herein relate to a system, including: a time-interleaved analog-to-digital converter (ADC) configured to operate at a sample rate of fs, the time-interleaved ADC including: an input terminal configured to receive an analog input signal, an output terminal configured to output a digital signal, wherein the digital signal is a digital approximation of the analog input signal, and a plurality of ADC units, wherein each ADC unit of the plurality of ADC units is configured to: measure an analog value of the analog input signal, convert the analog value to a digital value, and transmit the digital value to the output terminal of the time-interleaved ADC; a controller configured to: receive a clock signal having a frequency determined by fs, and at a rate determined by the clock signal, sequentially enable ADC units of the plurality of ADC units; an ADC tag generator configured to: receive the clock signal, and use the clock signal to generate an ADC unit identifier output signal that identifies an ADC unit of the plurality of ADC units that is currently enabled; and a machine learning system configured to: receive the digital signal from the output terminal of the time-interleaved ADC, receive the ADC unit identifier signal from the ADC tag generator, and modify the digital signal to generate a corrected digital signal by applying an error correction scheme that is associated with the ADC unit identified by the ADC unit identifier signal to compensate for analog-to-digital conversion errors occurring within the ADC unit, wherein the machine learning system determines the error correction scheme using ADC unit identifier signal.

In some aspects, the techniques described herein relate to a system, including: a time-interleaved analog-to-digital converter (ADC), including a plurality of ADC units connected in parallel between an input terminal and an output terminal of the time-interleaved ADC; an ADC tag generator configured to output a first identifier of a first ADC unit of the plurality of ADC when the first ADC unit is enabled; and an error correction system configured to: receive a first digital signal from the output terminal of the time-interleaved ADC, receive the first identifier of the first ADC unit from the ADC tag generator, modify the first digital signal to generate a first corrected digital signal by compensating for first analog-to-digital conversion errors occurring within the first ADC unit by applying a first error correction scheme that is associated with the first ADC unit, and output the first corrected digital signal.

In some aspects, the techniques described herein relate to a method, including: receiving a first digital output signal from a time-interleaved analog-to-digital converter (ADC), wherein the time-interleaved ADC includes a plurality of ADC units; receiving a first identifier from an ADC tag generator, wherein the first identifier identifies a first ADC unit of the plurality of ADC units that is currently enabled; and modifying the first digital output signal to generate a first corrected digital output signal by compensating for first analog-to-digital conversion errors occurring within the first ADC by applying a first error correction scheme that is associated with the first ADC.

The preceding detailed description is merely illustrative in nature and is not intended to limit the embodiments of the subject matter or the application and uses of such embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system, comprising:
a time-interleaved analog-to-digital converter (ADC) configured to operate at a sample rate of $f_s$,
the time-interleaved ADC including:
input terminal configured to receive an analog input signal,
an output terminal configured to output a digital signal, wherein the digital signal is a digital approximation of the analog input signal, and
a plurality of ADC units, wherein each ADC unit of the plurality of ADC units is configured to:
measure an analog value of the analog input signal,
convert the analog value to a digital value, and
transmit the digital value to the output terminal of the time-interleaved ADC;
a controller configured to:
receive a clock signal having a frequency determined by $f_s$, and
at a rate determined by the clock signal, sequentially enable ADC units of the plurality of ADC units;
an ADC tag generator configured to:
receive the clock signal, and
use the clock signal to generate an ADC unit identifier output signal that identifies an ADC unit of the plurality of ADC units that is currently enabled; and
a machine learning system configured to:
receive the digital signal from the output terminal of the time-interleaved ADC,
receive the ADC unit identifier signal from the ADC tag generator, and
modify the digital signal to generate a corrected digital signal by applying an error correction scheme that is associated with the ADC unit identified by the ADC unit identifier signal to compensate for analog-to-digital conversion errors occurring within the ADC unit, wherein the machine learning system determines the error correction scheme using ADC unit identifier signal.

2. The system of claim 1, further comprising a sensor configured to provide a parameter to the machine learning system, wherein the output of the ADC unit varies as a function of a value of the parameter.

3. The system of claim 2, wherein the machine learning system has been configured by a training phase to compensate for variations in the output of the ADC unit using the parameter.

4. The system of claim 2, wherein the parameter includes at least one of a semiconductor manufacturing related process variation, a voltage, and a temperature.

5. The system of claim 1, wherein the analog-to-digital conversion errors includes gain and direct current offset errors.

6. The system of claim 1, wherein the machine learning system includes a neural network having a plurality of neurons arranged in a network having fewer than three layers and fewer than ten neurons in each layer.

7. The system of claim 1, wherein the ADC tag generator includes at least one of a modulo-N counter and an N-bit shift register, wherein N is equal to a number of ADC units in the plurality of ADC units.

8. A system, comprising:
a time-interleaved analog-to-digital converter (ADC), including a plurality of ADC units connected in parallel between an input terminal and an output terminal of the time-interleaved ADC;
an ADC tag generator configured to output a first identifier of a first ADC unit of the plurality of ADC when the first ADC unit is enabled; and
an error correction system configured to:
receive a first digital signal from the output terminal of the time-interleaved ADC,
receive the first identifier of the first ADC unit from the ADC tag generator,
modify the first digital signal to generate a first corrected digital signal by compensating for first analog-to-digital conversion errors occurring within the first ADC unit by applying a first error correction scheme that is associated with the first ADC unit, and
output the first corrected digital signal.

9. The system of claim 8, wherein:
the ADC tag generator is configured to output a second identifier of a second ADC unit of the plurality of ADC when the second ADC unit is enabled; and
the error correction system is configured to:
receive a second digital signal from the output terminal of the time-interleaved ADC,
receive the second identifier of the second ADC unit from the ADC tag generator,
modify the second digital signal to generate a second corrected digital signal by compensating for second analog-to-digital conversion errors occurring within the second ADC unit by applying a second error correction scheme that is associated with the second ADC unit, and
output the second corrected digital signal.

10. The system of claim 8, wherein the error correction system includes a machine learning system that has been configured by a training phase to compensate for the analog-to-digital conversion errors.

11. The system of claim 10, wherein the machine learning system includes a neural network having a plurality of neurons arranged in a network having fewer than three layers and fewer than ten neurons in each layer.

12. The system of claim 8, further comprising a sensor configured to provide a parameter to the error correction system, wherein the outputs of the plurality of ADC units vary as a function of a value of the parameter.

13. The system of claim 12, wherein the parameter includes at least one of a semiconductor manufacturing related process variation, a voltage, and a temperature.

14. The system of claim 8, wherein the first analog-to-digital conversion errors include gain and direct current offset errors.

15. The system of claim 8, wherein the time-interleaved ADC includes a controller configured to:
receive a clock signal having a frequency determined by $f_s$, and
at a rate determined by the clock signal, sequentially enable ADC units of the plurality of ADC units.

16. The system of claim 15, wherein the ADC tag generator is configured to:
receive the clock signal; and
use the clock signal to generate an ADC unit identifier output signal that sequentially identifies ADC units of the plurality of ADC units when they are enabled and transmit the ADC unit identifier output signal to the error correction system.

17. A method, comprising:
receiving a first digital output signal from a time-interleaved analog-to-digital converter (ADC), wherein the time-interleaved ADC includes a plurality of ADC units;
receiving a first identifier from an ADC tag generator, wherein the first identifier identifies a first ADC unit of the plurality of ADC units that is currently enabled; and
modifying the first digital output signal to generate a first corrected digital output signal by compensating for first analog-to-digital conversion errors occurring within the first ADC by applying a first error correction scheme that is associated with the first ADC.

18. The method of claim 17, further comprising:
receiving a second digital output signal from the time-interleaved ADC;
receiving a second identifier from the ADC tag generator, wherein the second identifier identifies a second ADC unit of the plurality of ADC units that is generating the second digital output signal; and
modifying the second digital output signal to generate a second corrected digital output signal by compensating for second analog-to-digital conversion errors occurring within the second ADC by applying a second error correction scheme that is associated with the second ADC.

19. The method of claim 17, further comprising receiving a parameter that includes at least one of a semiconductor manufacturing related process variation, a voltage, and a temperature and wherein the first error correction scheme is configured to compensate for variations in the output of the first ADC unit using the parameter.

20. The method of claim 17, wherein the time-interleaved ADC has a sample rate of $f_s$ and further comprising:
receiving a clock signal having a frequency determined by $f_s$; and
using the clock signal to generate an ADC unit identifier output signal that identifies an ADC unit of the plurality of ADC units that is currently enabled.

* * * * *